United States Patent
Tarafdar et al.

(10) Patent No.: US 7,148,155 B1
(45) Date of Patent: Dec. 12, 2006

(54) SEQUENTIAL DEPOSITION/ANNEAL FILM DENSIFICATION METHOD

(75) Inventors: Raihan M. Tarafdar, San Jose, CA (US); George D. Papasouliotis, Sunnyvale, CA (US); Ron Rulkens, Milpitas, CA (US); Dennis M. Hausmann, Los Gatos, CA (US); Jeff Tobin, Mountain View, CA (US); Adrianne K. Tipton, Pleasanton, CA (US); Bunsen Nie, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/975,028

(22) Filed: Oct. 26, 2004

(51) Int. Cl.
   *H01L 21/31* (2006.01)
   *H01L 21/469* (2006.01)

(52) U.S. Cl. .............. 438/778; 257/E21.576; 438/775

(58) Field of Classification Search ........ 438/778, 438/775; 257/E21.576; 427/255.7, 255.18, 427/255.28, 255.393, 255.37
See application file for complete search history.

(56) References Cited

U.S. PATENT DOCUMENTS

| | | | |
|---|---|---|---|
| 5,314,724 A | 5/1994 | Tsukune et al. | |
| 5,525,550 A | 6/1996 | Kato | |
| 5,527,561 A | 6/1996 | Dobson | |
| 5,705,028 A | 1/1998 | Matsumoto | |
| 5,985,770 A | 11/1999 | Sandhu et al. | |
| 6,030,881 A | 2/2000 | Papasouliotis et al. | 438/424 |
| 6,102,993 A | 8/2000 | Bhandari et al. | |
| 6,133,160 A | 10/2000 | Komiyama et al. | |
| 6,184,143 B1 | 2/2001 | Ohashi et al. | |
| 6,300,219 B1 | 10/2001 | Doan et al. | |
| 6,316,063 B1 | 11/2001 | Andideh et al. | |
| 6,335,261 B1 | 1/2002 | Natzle et al. | 438/435 |
| 6,352,943 B1 | 3/2002 | Maeda et al. | |
| 6,352,953 B1 | 3/2002 | Seki et al. | |
| 6,372,669 B1 | 4/2002 | Sandhu et al. | |
| 6,503,330 B1 | 1/2003 | Sneh et al. | 118/715 |
| 6,511,539 B1 | 1/2003 | Raaijmakers | 257/424 |
| 6,531,377 B1 | 3/2003 | Knorr et al. | |
| 6,534,395 B1 * | 3/2003 | Werkhoven et al. | 438/627 |
| 6,534,802 B1 | 3/2003 | Schuegraf | |
| 6,540,838 B1 | 4/2003 | Sneh et al. | 438/690 |
| 6,551,339 B1 | 4/2003 | Gavronsky | 506/151 |
| 6,551,399 B1 | 4/2003 | Sneh et al. | 117/102 |
| 6,802,944 B1 | 10/2004 | Ahmad et al. | |

(Continued)

FOREIGN PATENT DOCUMENTS

WO    WO02/27063    4/2002

(Continued)

OTHER PUBLICATIONS

Dennis Michael Hausmann, "Atomic Layer Deposition of Metal Oxide Thin Films," A thesis presented by, Harvard University, 186 pages, Jul. 2002.

(Continued)

*Primary Examiner*—Caridad Everhart
(74) *Attorney, Agent, or Firm*—Beyer Weaver & Thomas LLP

(57) ABSTRACT

A silicon dioxide-based dielectric layer is formed on a substrate surface by a sequential deposition/anneal technique. The deposited layer thickness is insufficient to prevent substantially complete penetration of annealing process agents into the layer and migration of water out of the layer. The dielectric layer is then annealed, ideally at a moderate temperature, to remove water and thereby fully densify the film. The deposition and anneal processes are then repeated until a desired dielectric film thickness is achieved.

34 Claims, 7 Drawing Sheets

U.S. PATENT DOCUMENTS

| | | | |
|---|---|---|---|
| 6,861,334 B1 | 3/2005 | Raaijmakers et al. | |
| 6,867,152 B1 | 3/2005 | Hausmann et al. | |
| 6,908,862 B1 | 6/2005 | Li et al. | |
| 2001/0049205 A1 | 12/2001 | Sandhu et al. | |
| 2003/0015764 A1* | 1/2003 | Raaijmakers et al. | 257/424 |
| 2003/0092241 A1 | 5/2003 | Doan et al. | |
| 2003/0129828 A1 | 7/2003 | Cohen et al. | |
| 2003/0157781 A1 | 8/2003 | Macneil et al. | |
| 2004/0004247 A1* | 1/2004 | Forbes et al. | 257/324 |
| 2004/0043149 A1 | 3/2004 | Gordon et al. | |
| 2004/0044127 A1 | 3/2004 | Okubo et al. | |
| 2004/0079728 A1 | 4/2004 | Mungekar et al. | |
| 2004/0102031 A1 | 5/2004 | Kloster et al. | |
| 2004/0206267 A1 | 10/2004 | Sambasivan et al. | |
| 2005/0054213 A1 | 3/2005 | Derderian et al. | |
| 2005/0112282 A1 | 5/2005 | Gordon et al. | |
| 2005/0239264 A1 | 10/2005 | Jin et al. | |

FOREIGN PATENT DOCUMENTS

| | | |
|---|---|---|
| WO | WO03/083167 A1 | 10/2003 |

OTHER PUBLICATIONS

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

Papasouliotis et al., "Method for Controlling Properties of Conformal Silica Nanolaminates Formed by Rapid Vapor Deposition", Novellus Systems, Inc., U.S. Appl. No. 10/874,696, filed Jun. 22, 2004, pp. 1-29.

Ritala et al., "Atomic Layer Deposition", Handbook of Thin Films Materials, vol. 1, 2002, pp. 103-159.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Sep. 22, 2005, from U.S. Appl. No. 10/874,814.

Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35µm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4 + O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atomospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon FlowFill vs FHDP", Novellus Systems, Inc., pp. 1-12.

Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.

Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

Papasouliotis, George D., "Optimal Operation of Conformal Silica Deposition Reactors", Novellus Systems, Inc., U.S. Appl. No. 11/077,198, filed Mar. 9, 2005, pp. 1-32.

Papasouliotis, George D., "Optimal Operation of Conformal Silica Deposition Reactors", Novellus Systems, Inc., U.S. Appl. No. 11/077,108, filed Mar. 9, 2005, pp. 1-31.

Cho et al., "Hydroxyl Bond Removal and Film Densification Method for Oxide Films Using Microwave Post Treatment", Novellus Systems, Inc., Appln. No. Not yet assigned, filed Nov. 15, 2005, pp. 1-27.

U.S. Office Action mailed Nov. 10, 2005, from U.S. Appl. No. 11/021,558.

U.S. Office Action mailed Dec. 30, 2005, from U.S. Appl. No. 11/026,284.

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Dec. 5, 2005, from U.S. Appl. No. 10/746,274.

U.S. Office Action mailed Dec. 7, 2005, from U.S. Appl. No. 10/874,808.

* cited by examiner

SEQUENTIAL DEPOSITION/ANNEAL FILM DENSIFICATION METHOD

BACKGROUND OF THE INVENTION

The present invention relates to the formation of dielectric films, in particular to the formation of dense dielectric films in high aspect ratio features on semiconductor substrates.

It is often necessary in semiconductor processing to fill a high aspect ratio gap with insulating material. One example of a high aspect ratio trench encountered in semi-conductor processing is in the formation of shallow trench isolation (STI). As device dimensions shrink and thermal budgets are reduced, void-free filling of high aspect ratio spaces (AR>3.0:1) becomes increasingly difficult due to limitations of existing deposition processes. The deposition of doped or undoped silicon dioxide assisted by high density plasma CVD, a directional (bottom-up) CVD process, is the method currently used for high aspect ratio (AR) gap-fill. Evolving semiconductor device designs and dramatically reduced feature sizes have resulted in several applications where HDP processes are challenged in filling the high aspect ratio structures (AR>7:1) using existing technology (see, for example, U.S. Pat. No. 6,030,881). For structures representative of the 65 nm and 45 nm technology nodes, engineering the gap-fill process becomes structure dependent, hence the process needs to be reoptimized, a task of considerable complexity, every time a new structure needs to be filled.

An alternative to CVD is atomic layer deposition (ALD). ALD methods involve self-limiting adsorption of reactant gases and can provide thin, conformal dielectric films within high aspect ratio features. An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal-doped silicon oxide. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

A related technique, referred to as rapid vapor deposition (RVD) processing, is another alternative. RVD is similar to ALD in that reactant gases are introduced alternately over the substrate surface, but in RVD the silicon oxide film can grow more thickly. Thus, RVD methods allow for rapid film growth similar to using CVD methods but with the film conformality of ALD methods. The process is described in the paper by Hausmann et. al. entitled Rapid Vapor Deposition of Highly Conformal Silica Nanolaminates (2002, Science, 298, pages 403–406).

Deposited oxide films require densification in order for its properties to match those of thermally generated silicon oxide (USG, which will allow its successful integration into functioning devices. Densification removes water from the deposited film. Moreover, the conformal nature of the process results in the formation of seams in filled trenches, which may allow attack by post gap fill wet etch (HF-based) in the seam. Etching in the seam can allow for polysilicon deposition in the seam during subsequent processing which would obviate its insulating effect. Therefore, a process sequence to anneal the film and substantially eliminate seams and voids is required.

Optimally, this process sequence can operate at under 500° C., in order to be able to meet the thermal budget requirements of advanced devices (see A. R. Londergan, et. al., J. Electrochem. Soc., vol. 148, pp. C21–C27, January 2001). In pre-metal dielectric (PMD) applications, for example, where a layer of silica is applied over gates that have been previously built-up on a substrate, there is an inherent temperature limitation due to the material used to construct the gates, usually a metal silicide such as a nickel silicide. At temperatures above about 400–500° C., the gate silicide may become discontinuous, thereby increasing the resistance of the circuit and leading to performance problems. Further, there may be two or three PMD layers applied to a substrate before application of metal conductors. Thus, it is desirable to implement a method to improve the material properties of the dielectric film, ideally maintaining temperatures that are low enough to avoid damaging underlying heat sensitive structures.

SUMMARY OF THE INVENTION

The present invention addresses this need by providing a multi-step method of forming a densified silicon oxide-based dielectric film. First, a thin layer of silicon oxide-based dielectric is thermally deposited. Then, the dielectric film is densified by an annealing process that removes water from the deposited layer. The deposition and anneal steps are then repeated until the desired dielectric film thickness is obtained. The technique enables dielectric gap fill to the 45 nm technology node and beyond, while maintaining film properties. It accomplishes the densification of the thermally deposited oxide films without the need for high temperature anneal in structures as deep as 1 um.

The dielectric deposition may be by any suitable process, for example CVD, SOG (spin-on glass), or metal-catalyzed RVD. The dielectric may be any suitable silicon oxide-based material, doped or undoped, for example undoped silicon dioxide (undoped silica glass (USG)). The deposited dielectric layers should be thin enough that they are substantially completely penetrated by the annealing process agent (e.g., Oxygen-based plasma, heat, radiation or associated active chemical species) and that the water ($H_2O$) generated during annealing can migrate out of the layer. In this manner, efficient removal of $H_2O$ from the film is facilitated, since the diffusion length for $H_2O$ is reduced relative to conventional thicker film depositions. In general, a layer thickness of about 300–3000 Å or 500–1500 Å, for example about 1000 Å is suitable.

Annealing may be accomplished by a number of different techniques, including thermal, plasma and radiation based processes. A preferred annealing process is high density plasma (HDP)-based. A high density plasma in an oxidizing environment can densify thin dielectric films at low temperatures. Thus, this technique has the advantage of annealing while staying within the thermal budget constraints of temperature sensitive dielectric formation applications, e.g., PMD.

In one embodiment, silica nanolaminates formed in a high aspect ratio feature by rapid vapor deposition (RVD) are annealed in a HDP reactor in order to densify the layers and eliminate seams and voids, which are caused by the conformal nature of RVD. This method involves the following principle operations: 1) exposing a substrate surface to a catalytic metal-containing precursor gas to form a substantially saturated layer of catalytic metal-containing precursor on the substrate surface, 2) exposing the substrate surface to a silicon-containing precursor gas to form a thin dielectric layer on the substrate surface, 3) annealing the thin layer at a temperature below 500° C. using HDP under oxidizing conditions; and 4) repeating 1) to 3) until a desired dielectric film thickness is achieved, e.g., until the gap is filled. The $O_2$ based HDP reactive plasma results in film densification and cross-linking at temperatures of less than 500° C. Low temperature operation is enabled by the high concentration of reactive species in the high density plasma. The film expands as a result of Si—O bond formation during annealing, eliminating seams in the film, a critical element for its successful integration. Optimizing film properties at low temperature allows for the use of the film low thermal budget PMD applications.

The method of the invention can be used for forming a dielectric film for any purpose. In a specific embodiment, it is used for filling structures, such as gaps, in particular high aspect ratio trenches, on semiconductor substrates, e.g., IMD, PMD and STI applications.

Various RVD process precursors may be used in preferred embodiments of the invention. For example, the catalytic metal-containing precursor can be an aluminum-containing precursor, such as hexakis(dimethylamino) aluminum or trimethyl aluminum. Flow rates of aluminum-containing precursor gas can range broadly, e.g., between about 1 and 10000 sccm. Preferred flow rates of aluminum-containing precursor gas range between about 100 and 400 sccm.

The silicon containing precursor can be a silanol, such as tris(tert-butoxy)silanol $((C_4H_9O)_3SiOH)$ or tris(tert-pentoxy)silanol $((C_5H_{11}O)_3SiOH)$, or a silanediol, such as di(tert-butoxy)silandiol. Preferred flow rates for the silicon-containing precursor range between about 200 to 1000 sccm.

The resulting dielectric film has improved properties after annealing. For example, the dielectric film may have a k-value of between about 3.8–4.0, a film stress of between about 2 Gdyn/cm$^2$ tensile and 2 Gdyn/cm$^2$ compressive, and a wet etch rate ratio (WERR) of less than 1.3:1 relative to conventionally formed thermal oxide.

Exposure to the aluminum-containing precursor and the silicon-containing precursor may occur in the same chamber or different chambers in preferred embodiments of the invention. Further, additional precursor gases may be used.

These and other aspects and advantages of the present invention are described below.

DETAILED DESCRIPTION OF SPECIFIC EMBODIMENTS

Figure 1A:
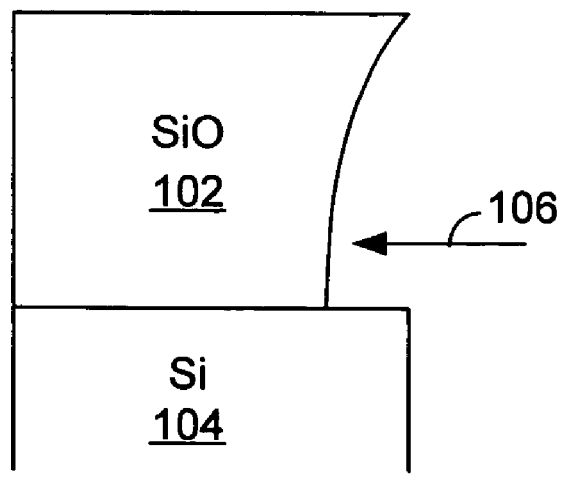
FIGS. 1A–B illustrate the problem of incomplete densification of the film and the improved results obtainable using the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

As indicated, the present invention provides a multi-step method of forming a densified silicon oxide-based dielectric film. First, a thin layer of silicon oxide-based dielectric is thermally deposited. Then, the dielectric film is densified by an annealing process that removes water from the deposited layer. The deposition and anneal steps are then repeated until the desired dielectric film thickness is obtained. The technique enables dielectric gap fill to the 45 nm technology node and beyond, while maintaining film properties. It accomplishes the densification of the thermally deposited oxide films without the need for high temperature anneal in structures as deep as 1 um.

General Process Parameters

The dielectric deposition may be by any suitable thermal process, for example CVD or metal-catalyzed RVD. The dielectric may be any suitable silicon oxide-based material, doped or undoped, for example undoped silicon dioxide (undoped silica glass (USG)). The deposited dielectric layers should be thin enough that they are substantially completely penetrated by the annealing process agent (e.g., oxygen-based plasma, heat, radiation or associated active chemical species) and that the water ($H_2O$) generated during annealing can migrate out of the layer. In this manner, efficient removal of $H_2O$ from the film is facilitated, since the diffusion length for $H_2O$ is reduced relative to conventional thicker film depositions. In general, a layer thickness of about 300–3000 Å or 500–1500 Å, for example about 1000 Å is suitable.

As described further below, annealing may be accomplished by a number of different techniques, including thermal, plasma and radiation based processes. Specific examples of suitable annealing processes include thermal, furnace based; (rapid thermal processing (RTP) or rapid thermal oxidation (RTO) based; high density plasma based; capacitive (PECVD) plasma based; laser ablation based; UV film cure based; IR film cure based; and microwave plasma based. One suitable annealing process is high density plasma (HDP)-based. A high density plasma in an oxidizing environment can fully and uniformly densify thin dielectric films at low temperatures. Alternative anneal processes can be thermal based, carried out in a furnace with an oxidizing environment, or incorporate a radiation anneal (UV for example). These techniques have the advantage of annealing while staying within the thermal budget constraints of temperature sensitive dielectric formation applications, e.g., PMD.

The anneal process is rate limited by the diffusion of $H_2O$ through the film. Therefore, thicker films (e.g., greater than 500 nm thick) or films deposited in the deep trenches, which are encountered in STI and PMD applications, cannot be fully densified in a single anneal step. FIGS. 1A and B illustrate this problem of incomplete densification of the film and the improved results obtainable using the present invention.

FIG. 1A shows a thick oxide film 102, e.g., greater than 3000 Å of RVD silicon dioxide, deposited on a silicon substrate 104 in a single step following annealing with an HDP plasma in a single step. Since $H_2O$ removal during the anneal process is diffusion limited, it is easier for water to diffuse from the top of the film than the bottom. Wet etch rate ratio (WERR) data collected for such films shows a variable film density, decreasing as a function of depth. As a result, when the film is etched (the etch direction is shown by arrow 106), the amount of film etched is not uniform across the thickness of the film; the amount etched at the top, densified portion, of the film is less than the amount etched at the bottom. Non-uniformity of the etch causes overhang features which contribute to problems including the formation of voids during high aspect ratio gap fill.

Figure 1B:
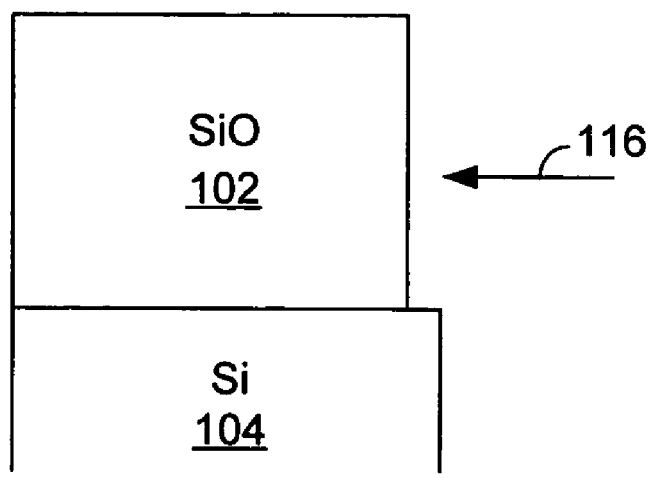

FIG. 1B shows an oxide film 112 of the same thickness as 102 (FIG. 1A), e.g., greater than 3000 Å of RVD silicon dioxide, on a silicon substrate 114. However, in this case, the film is deposited and annealed by the multi-step technique of the present invention in which thin (e.g. 1000 Å) oxide layers are deposited and annealed in series to build up the total desired film thickness. In this way, the annealing process agent (e.g., oxygen-based plasma, heat, radiation or associated active chemical species) is able to fully penetrate the layer and water is able to diffuse through the entire film thickness. As a result, when the film is etched (the etch direction is shown by arrow 116), the amount of film etched is uniform across the thickness of the film.

In one embodiment where the dielectric deposition is used to fill gaps, the gap is partially filled with a layer of oxide; then the oxide layer is annealed to fully densify the oxide layer. These steps are repeated until the gap is filled with a fully densified oxide film.

The post-deposition annealing treatment step can be carried out in situ in the deposition chamber, in an integrated mode (tool), or in a separate chamber (with vacuum break). It can be carried out in an oxidizing or inert ambient (e.g., $N_2$) environment. For example, the use of steam as an ambient gas for the post-deposition anneal processing of oxide-based film is a known technique.

The anneal step is followed by a second deposition step and the cycle is repeated until the desired fully densified film thickness is achieved, e.g., the structure is fully filled and densified.

Figure 2:
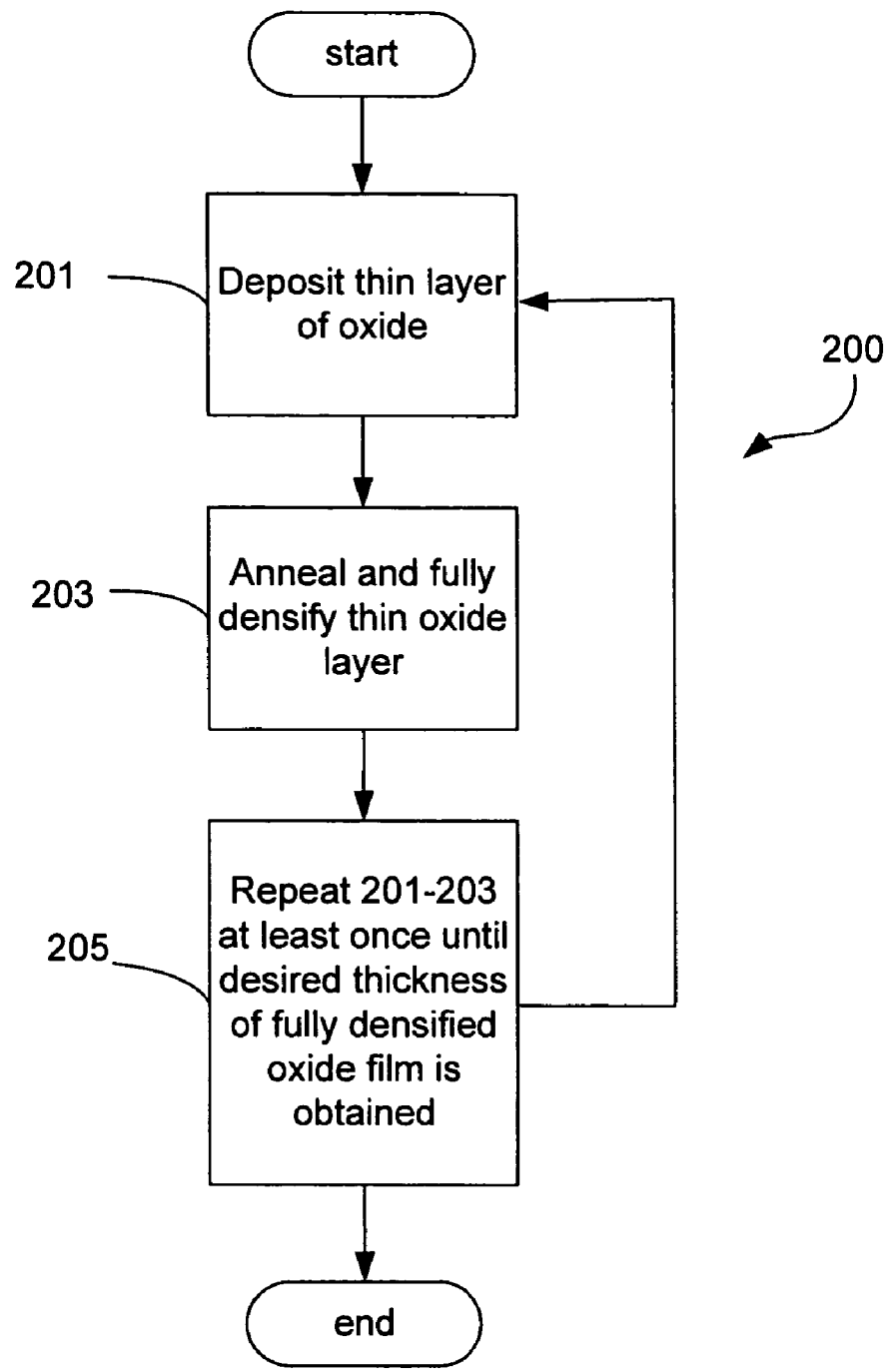
FIG. 2 is a process flow diagram illustrating relevant operations of a multi-step sequential deposition/anneal process to form a fully densified dielectric film in accordance with the present invention.

The foregoing process is summarized in FIG. 2 which provides a flow illustration of a process in accordance with the present invention. A thin oxide layer is deposited on a substrate, for example by exposing the substrate surface to a silicon-containing precursor gas to form a silicon oxide-based dielectric film layer on the substrate (201). If the dielectric is deposited over a substrate feature such as a gap, the thin layer only partially fills the gap. In general, the layer is sufficiently thin to not prevent substantially complete penetration of the annealing agent into the layer and migration of water out of the layer. The thin layer is then annealed to remove water (203), and the deposition and anneal steps are repeated at least once to form a densified dielectric film of a desired thickness, e.g., a film the fills a gap (205).

Figure 3A:
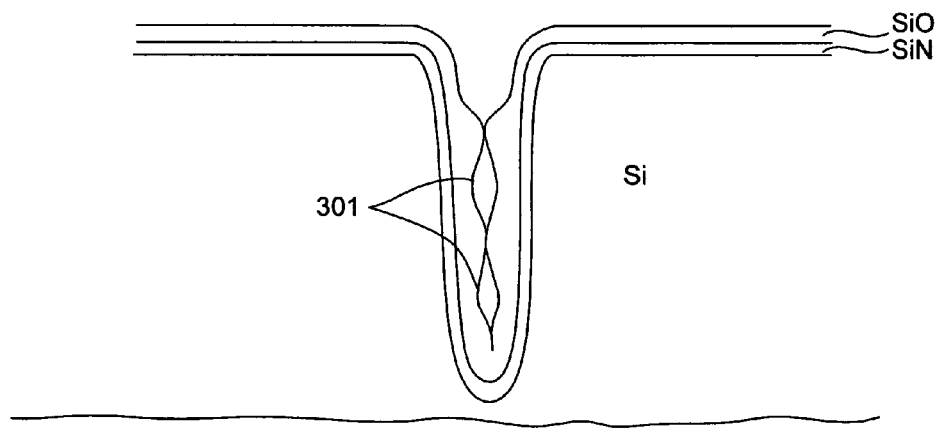
FIGS. 3A–B illustrate the relative improvement in performance achieved by the method of the present invention in a gap fill application.
Figure 3B:
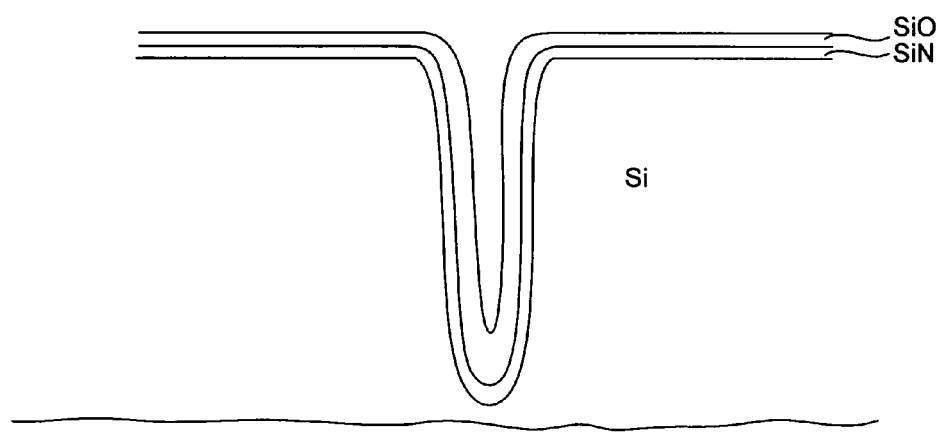

The relative improvement in performance achieved by the method of the present invention in a gap fill application is illustrated in FIGS. 3A and B. FIG. 3A represents a single step RVD oxide deposition and anneal process. Decoration of such a sample (e.g., by 6:1 BOE for 10 sec) dissolves low density (only partially densified) oxide material and creates voids 301 in the trench. FIG. 3B represents a multi-step process in accordance with the invention, each cycle a RVD thin oxide deposition followed by anneal. Since the film is fully densified, no material is dissolved by decoration of such a sample in the same way. Hence, the film's performance is improved. For example in post-STI processing (such as wet dips) the film will be better at preventing any void or open seam formation.

RVD/HDP Embodiment

A preferred annealing process is high density plasma (HDP)-based. A high density plasma in an oxidizing environment can fully and uniformly densify thin dielectric films at low temperatures. This technique has the advantage of annealing while staying within the thermal budget constraints of temperature sensitive dielectric formation applications, e.g., PMD.

Generally, a RVD method involves sequentially depositing a plurality of atomic-scale films on a substrate surface by sequentially exposing and removing reactants to and from the substrate surface. An exemplary case of RVD using reactant gases A and B will now be used to illustrate principle operations of a RVD process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple of monolayers.

After a saturated layer of A is formed, typically, the remaining gas A in the chamber is purged using an inert gas. Thereafter, the gas B is injected so that it comes in contact with the adsorbed layer of A and reacts to form a reaction product of A and B. Because the saturated layer of A is nominally thin and evenly distributed over the substrate surface, excellent film step coverage can be obtained. B is flowed over the substrate for a period of time sufficient to allow the reaction between A and B to preferably go to completion; i.e., all of the adsorbed A is consumed in the reaction. In a RVD process, B is flowed over the substrate for a period of time sufficient for B to accumulate to thicknesses in excess of one monolayer. After a desired film thickness is achieved, the flow of B is stopped and the reaction is halted. At this point, residual gas B and any byproducts of the reaction are purged from the chamber. Further RVD cycles of substrate exposure to A, followed by exposure to B, can be implemented and repeated as needed for multiple layers of material to be deposited.

RVD methods are related to the well-established chemical vapor deposition (CVD) techniques; both are thermal deposition techniques. However, in CVD, the chemical reactant gases' are simultaneously introduced in a reaction chamber and allowed to mix and chemically react with each other in gas phase. The products of the mixed gases are then deposited on the substrate surface. Thus, RVD methods differ from CVD since in RVD the chemical reactant gases are individually injected into a reaction chamber and not allowed to mix prior to contacting the substrate surface. That is, RVD is based on separated surface-controlled reactions. Either RVD, CVD, or spin-on glass deposition may be used for film deposition in accordance with the present invention.

Figure 4:
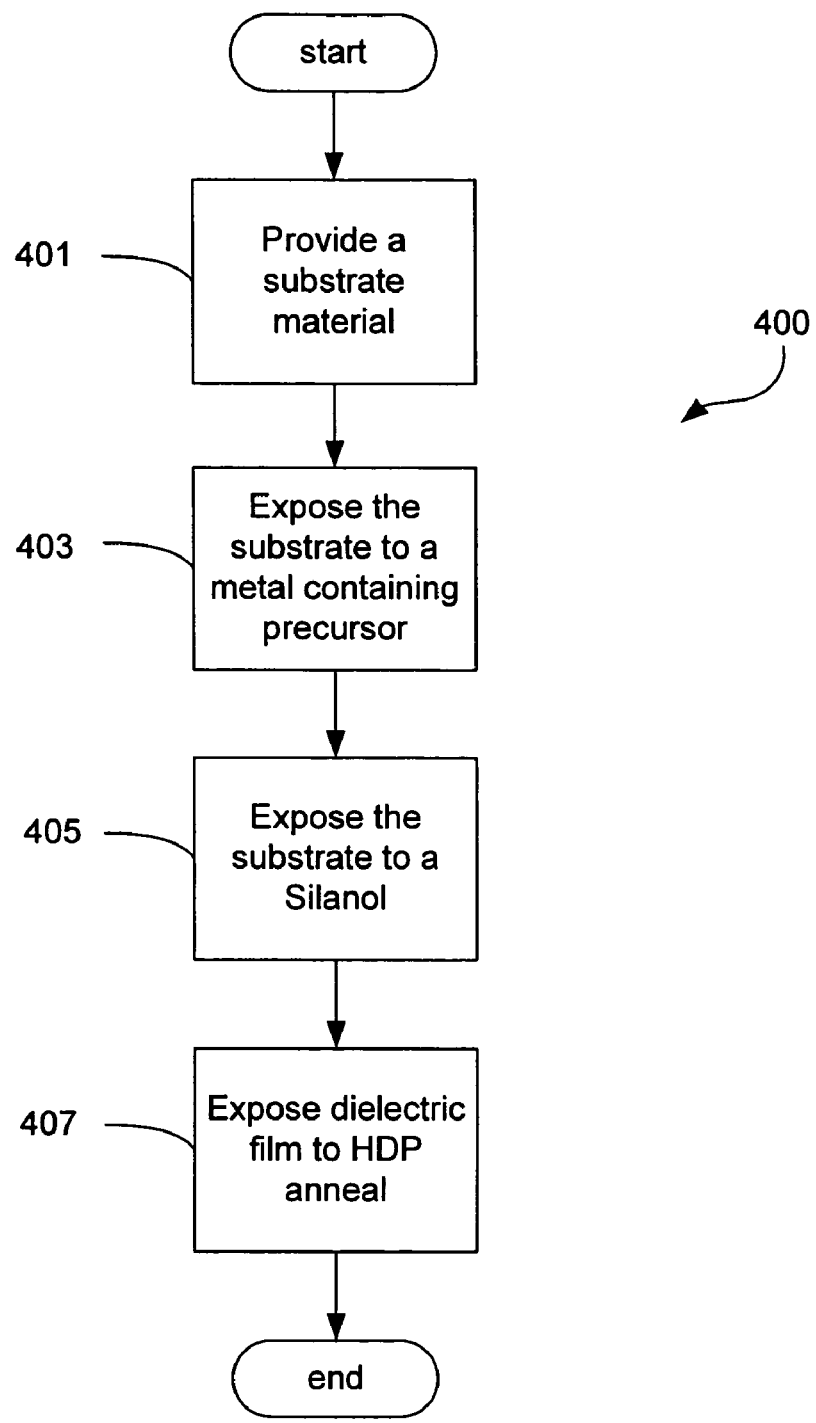
FIG. 4 a process flow diagram illustrating relevant operations employing rapid vapor deposition (RVD) plus HDP/$O_2$ anneal to form a fully densified dielectric film in accordance with the present invention.

FIG. 4 is a process flow diagram illustrating relevant operations in a multi-step rapid vapor deposition (RVD) and high-density plasma (HDP) anneal process to form a fully densified dielectric film in accordance with one embodiment of the present invention.

The deposition process 400 begins with operation 401, wherein a substrate is placed into a deposition chamber. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, two commercially important applications of the present invention are premetal dielectric (PMD) and shallow trench isolation (STI).

Next, in operations 403–405, an RVD process is used to deposit a dielectric layer on the substrate. For an example of a suitable RVD process, see U.S. patent application Ser. No. 10/672,309, titled "Properties Of A Silica Thin Film Produced By A Rapid Vapor Deposition [RVD] Process", filed on Sep. 26, 2003, which is incorporated by reference herein for all purposes. In operation 403, a metal catalyst-containing precursor gas is pumped into the deposition chamber so as to substantially saturate the surface with the metal-catalyst containing precursor.

Any suitable metal catalyst-containing precursor that can sufficiently adsorb onto the substrate surface and sufficiently react with the subsequently added silicon-containing precursor to form a dielectric layer that is more than a monolayer thick may be used. In addition, the metal-containing precursor should be capable of aiding the catalytic polymerization of the subsequently added silicon-containing precursor to produce a film thicker than a monolayer. In preferred embodiments, an aluminum-containing precursor, for example, hexakis(dimethylamino)aluminum ($Al_2(N(CH_3)_2)_6$) or trimethylaluminum ($Al(CH_3)_3$) is used. Other suitable aluminum-containing precursors include, for example, triethylaluminum ($Al(CH_2CH_3)_3$) or aluminum trichloride ($AlCl_3$). Other metal-containing precursors that can be deposited to reactivate the catalytic surface include, but are not limited to, zirconium, hafnium, gallium, titanium, niobium, tantalum, and their oxides or nitrides.

As indicated earlier, forming a saturated layer is a self-limiting process and to a certain extent independent of process conditions. Relevant process conditions can include pressure, precursor flow rate, substrate temperature, and dose. Pressures can range broadly, e.g., between about 1 mTorr and 760 Torr. Typical pressures range between about 100 and 750 mTorr and typical temperatures range between about 250 and 300 degrees Celsius. Flow rates of aluminum-containing precursor gas can range broadly, e.g., between about 1 and 10000 sccm. Preferred flow rates of aluminum-containing precursor gas range between about 100 and 400 sccm. The dose of aluminum-containing precursor can range broadly, e.g., between about 0.001 milligrams and 10 grams. Typical aluminum-containing precursor doses range between about 0.01 and 0.02 grams. Exposure times suitable for forming a saturated layer are typically only seconds. In some embodiments, for example, an exposure time of about 1 to 2 seconds is found to be sufficient.

Next, after the chamber is purged, process 400 continues with the exposure of the substrate to a silicon-containing precursor gas under conditions suitable for the growth of a dielectric film in operation 405. Any suitable silicon-containing precursor that can sufficiently adsorb onto and react with the saturated layer of aluminum-containing precursor to form a dielectric film may be used. In addition, the silicon-containing precursor should be capable of polymerization when exposed to the adsorbed metal (e.g., aluminum)-containing precursor to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol (($C_4H_9O)_3SiOH$), tris(tert-pentoxy)silanol (($C_5H_{11}O)_3SiOH$), di(tert-butoxy)silandiol (($C_4H_9O)_2Si(OH)_2$) and methyl di(tert-pentoxy)silanol.

While the invention is not limited to this theory of operation, as mentioned previously, it is believed that the accumulation of dielectric film is achieved via a polymerization process. The saturated layer of aluminum precursor can catalytically polymerize the silicon-containing precursor to produce growing chains of silica. After a period of growth determined by the substrate temperature, the silica polymer can "gel" or "cross-link" to form a solid silicon dioxide. The final film thickness depends on the silicon dioxide layer formation rate and the amount of time the silicon containing precursor is exposed to the saturated layer of aluminum atoms. The film can also be made thicker by repeating the number of precursor deposition cycles. Studies regarding these finding can be found in the doctoral thesis of Dennis Hausmann, Harvard University, (2002).

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. Temperatures can range from about 200 to 300° C. A typical deposition temperature is about 250° C. Pressures can range broadly, e.g., between about 1 mTorr and 760 Torr. Typical pressures range between about 100 and 750 mTorr. Flow rates of silicon-containing precursor gas can range broadly, e.g., between about 1 and 10000 sccm. Preferred flow rates of silicon-containing precursor gas range between about 200 and 1000 sccm. The dose of silicon-containing precursor can range broadly, e.g., between about 0.001 milligrams and 100 grams. Typical silicon-containing precursor doses range between about 0.1 and 0.3 grams. Exposure times can range broadly, e.g., between about 1 milliseconds and 100 seconds. Preferred exposure times typically range between about 1 and 10 seconds.

The deposited dielectric layer should be thin enough that it can be substantially completely penetrated by the annealing process agent (e.g., Oxygen-based plasma, heat, radiation or associated active chemical species) in the subsequent annealing process and that the water ($H_2O$) generated during annealing can migrate out of the layer. In general, a layer thickness of about 300–3000 Å or 500–1500 Å, for example about 1000 Å is suitable.

Returning to FIG. 4, after a thin dielectric layer has been formed, an anneal operation 407 using a low temperature oxygen-containing inductively coupled high density plasma (HDP) is performed in order to improve the mechanical properties of the film. The HDP anneal is used to remove water from the as-deposited film. In the present invention, HDP operation 407 is performed in an oxidizing environment. Specifically, the oxidizer used is an oxygen-containing oxidizer such as $O_2$, $H_2O$, $H_2O_2$, air, or $O_3$. One advantage of using an oxygen-containing oxidizer is that the oxygen in the plasma reacts with the RVD deposited film to cross-link the silica and reduce or eliminate seams created during RVD gap fills. At the same time, the oxygen substitutes for the water that is removed from the film in the anneal process so that the film does not shrink and the film stress is not increased by water removal. Note that it is important to eliminate the seam in gap fill (STI, for example) by annealing to prevent attack by post gap fill wet etch (HF-based) in the seam. Etching in the seam can allow for polysilicon deposition in the seam in subsequent processing which would obviate its insulating effect.

Suitable temperatures range from about 250° C. to 750° C.; suitable pressures range from about 1 to 1000 mTorr; and suitable time ranges from about 30 sec to 20 min. In one embodiment of the invention, the annealing operation lasts from between about 330 to 700 seconds. In a second embodiment, the annealing operation lasts about 600 seconds.

Operations 403–407 are repeated as necessary until a desired thickness of dielectric material has been reached, e.g., a gap has been filled.

The resulting dielectric film has improved properties after annealing. For example, the dielectric film may have a k-value of between about 3.8–4.0, a film stress of between about 2 Gdyn/cm$^2$ tensile and 2 Gdyn/cm$^2$ compressive, and a wet etch rate ratio (WERR) of less than 1.3:1 relative to conventionally formed thermal oxide.

Other Embodiments

This method applies to the deposition of silica (USG). However, this method may also be used for depositing doped silica films, such as fluorine-doped silicate glass (FSG), phosphosilicate glass (PSG), boro-phospho-silicate glass (BPSG), or carbon doped low-k materials.

Other deposition co-reactants, such as silanols with varying substituents (i.e. more than one kind of alkoxy substituent) may be used to improve the film characteristics. For an example, see U.S. patent application Ser. No. 10/874,814, filed Jun. 22, 2004, titled "Mixed Alkoxy Precursors and Methods of Their Use for Rapid Vapor Deposition of SiO$_2$ Films." Furthermore, the properties of the dielectric film may be improved by other means as well, including by using an aluminum oxide nucleation layer formed by ALD prior to the application of the silica layer. See, for example, U.S. patent application Ser. No. 10/875,158, filed Jun. 22, 2004, titled "Silica Thin Films Produced By Rapid Surface Catalyzed Vapor Deposition (RVD) Using a Nucleation Layer." Note also that this technique may be used in combination with a phosphorous getterer as described in U.S. patent application Ser. No. 10/874,808, filed Jun. 22, 2004, titled "Aluminum Phosphate Incorporation In Silica Thin Films Produced By Rapid Surface Catalyzed Vapor Deposition (RVD)." The above-referenced applications are incorporated by reference in their entirety for all purposes.

The method is primarily described with reference to a preferred RVD-based embodiment, however it is also applicable to any deposition technique that forms films requiring densification, in particular CVD films.

Also, as noted above, annealing may be accomplished by a number of different techniques other than the preferred and exemplified HDP/O$_2$ anneal, including thermal, furnace based (e.g., anneal at a temperature of greater than 700° C. for at least 30 minutes); (rapid thermal processing (RTP) or rapid thermal oxidation (RTO) based (e.g., anneal at a temperature of greater than 700° C. for at least 5 minutes in either inert (e.g., N$_2$) or oxidizing (e.g., 70% N$_2$, 30% steam) environments, respectively); capacitive (PECVD) plasma based (e.g., anneal at a source power (HF) of at least 5000 W at a temperature of about 400° C. for at least 10 minutes); microwave plasma based (e.g., anneal at a temperature of about 200 to 400° C., a pressure of about 1 to 100 Torr, an oxygen-containing gas flow of about 2 L/min, and a power of up to 10,000 W, for at least 3 minutes; laser ablation based; UV film cure based (e.g., at a power density of less than 5 W/cm$^2$, in either inert (e.g., N$_2$) or oxidizing environments); and IR film cure based.

Apparatus

The deposition and post-deposition annealing treatment steps can be carried out in situ in the same chamber, in an integrated mode (tool), or in separate chambers (with vacuum break). Some sample apparatus for implementing the invention are described below. While the apparatus described below relate to RVD and HDP annealing, it should be understood that these are just examples of deposition and annealing techniques suitable for implementation of the present invention. Several other deposition and anneal techniques, noted above, and associated apparatus, examples of which are known in the art, may alternatively be used.

Deposition Apparatus

Figure 5:
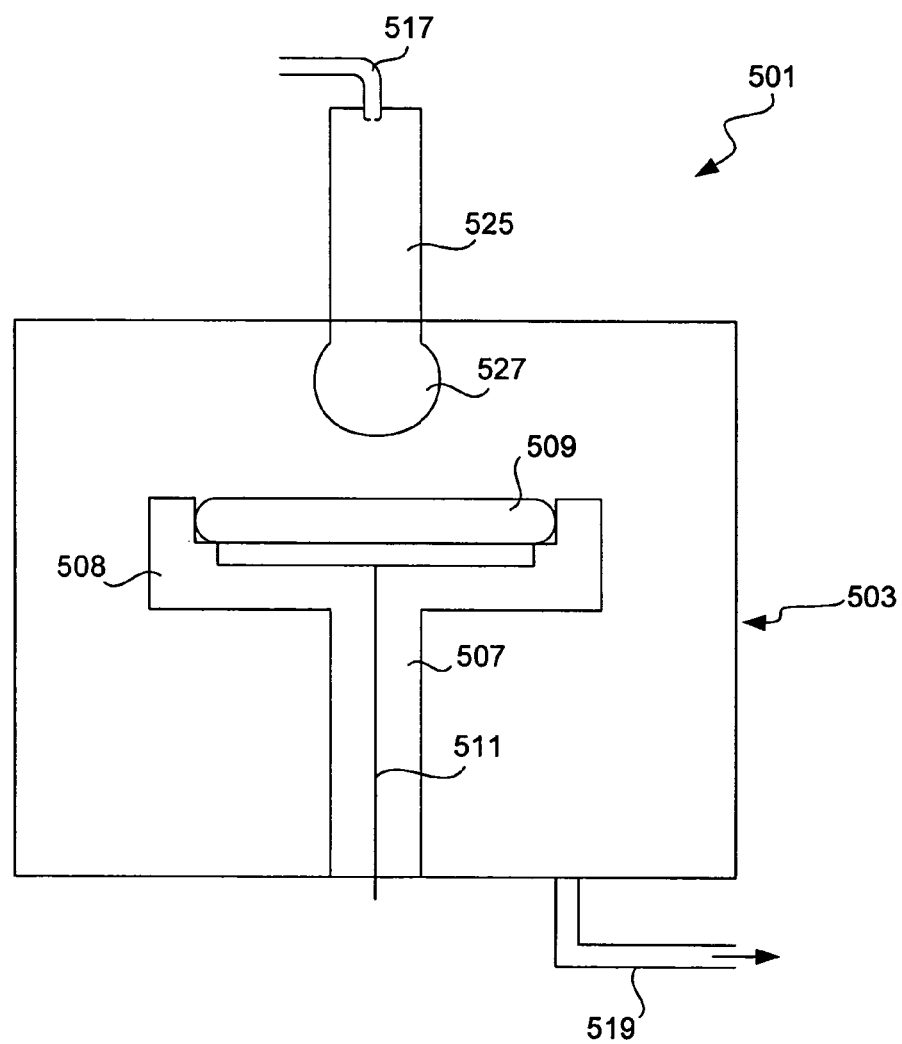
FIG. 5 is a schematic diagram showing the basic features of a RVD reactor module suitable for practicing the current invention.

FIG. 5 is a block diagram depicting some components of a suitable reactor for performing dielectric deposition using a RVD process in accordance with one embodiment of this invention. Note that this apparatus is only an example of suitable apparatus for deposition in accordance with this embodiment of the present invention. Many other apparatuses and systems, including a multi-chambered apparatus, may be used.

As shown, a reactor 501 includes a process chamber 503, which encloses components of the reactor and serves to contain the reactant gases and provide and area to introduce the reactant gases to substrate 509. The chamber walls may be made of or plated with any suitable material, generally a metal that is compatible with the deposition and associated processes conducted therein. In one example, the process chamber walls are made from aluminum. Within the process chamber, a wafer pedestal 507 supports a substrate 509. The pedestal 507 typically includes a chuck 508 to hold the substrate in place during the deposition reaction. The chuck 508 may be an electrostatic chuck, a mechanical chuck or various other types of chuck as are available for use in the industry and/or research.

A heat transfer subsystem including lines 511 for supplying a heat transfer fluid to the pedestal 507 controls the temperature of pedestal 507. In some embodiments, the heat transfer fluid comprises water or another liquid. The reactant gases, as well as inert gases during purge, are introduced individually into the reactor at tube 525 via inlet 517. A showerhead 527 may be used to distribute the gas flow uniformly in the process reactor. Reactant gases are introduced through a gas supply inlet mechanism including orifices. There may be multiple reactant gas tubes and inlets. A vacuum pump) connected to outlet 519 can draw out gases between RVD cycles.

Anneal Apparatus

Figure 6:
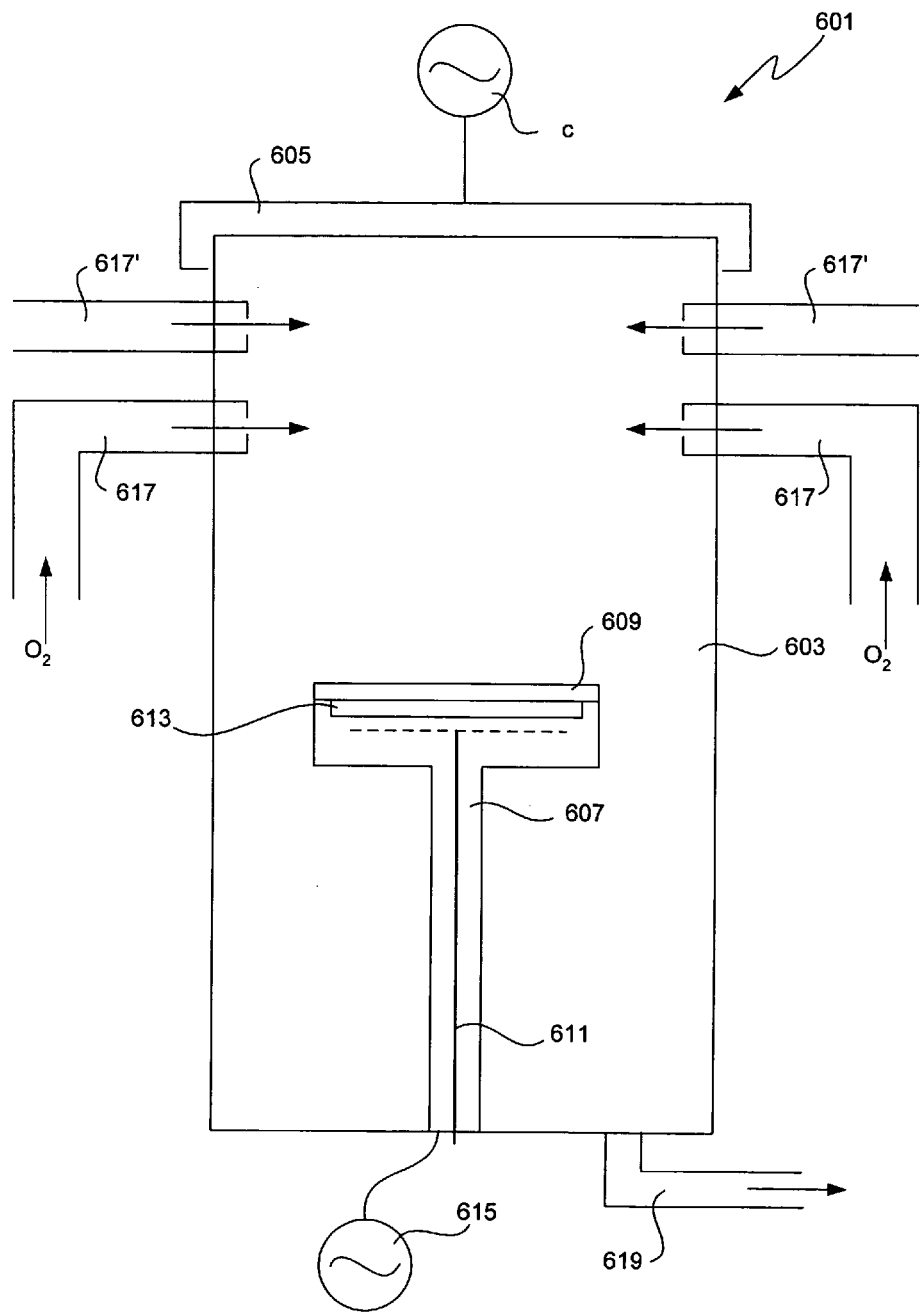
FIG. 6 is a schematic diagram showing the basic features of a HDP reactor module suitable for practicing the current invention.

In accordance with one embodiment of the present invention, post-deposition annealing may be conducted using a HDP-based process. FIG. 6 is a block diagram depicting some components of a suitable HDP reactor for performing HDP/O$_2$ annealing in accordance with one embodiment of this invention. Note that this apparatus is only an example of suitable apparatus for annealing in accordance with this embodiment of the present invention. Many other apparatuses and systems, including a multi-chambered apparatus, may be used.

The principal components of most suitable reactors include a reaction chamber, a process gas delivery system, a support for the substrate, one or more electrodes to generate a plasma and a bias source for the substrate. The particular design is not critical to this invention. It merely needs to support an inductively coupled high-density plasma generated by the appropriate gases over the appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

Referring to FIG. 6, a simple block diagram depicting various HDP reactor components arranged as in a conventional reactor is provided. As shown, a reactor 601 includes a process chamber 603 which encloses other components of the reactor and serves to contain the plasma generated by an electrode 605. In one example, the process chamber walls are made from aluminum, aluminum oxide, and/or other suitable material. Electrode 605 is powered by a "low frequency" RF source 606. The power and frequency supplied by source 606 is sufficient to generate high-density plasma from the process gas.

Within the reactor, a wafer pedestal 607 supports a substrate 609. The pedestal typically includes a chuck to hold the substrate in place during the deposition reaction. The chuck may be an electrostatic chuck, a mechanical chuck or various other types of chuck as are available for use in the industry and/or research.

A heat transfer subsystem including a line 611 for supplying a heat transfer fluid controls the temperature of substrate 609. In some embodiments, the heat transfer fluid comprises at least one of helium and argon gas. The heat transfer fluid is supplied to a space 613 between the surface of the substrate and a surface of the chuck.

A "high frequency" RF source 615 serves to electrically bias substrate 609 and draw charged precursor species onto the substrate for the deposition reaction. Electrical energy from source 615 is coupled to substrate 609 via an electrode or capacitive coupling, for example. Note that the bias applied to the substrate need not be an RF bias. Other frequencies and DC bias may be used as well. In a specific embodiment, source 615 supplies a radio frequency bias to the substrate, and the radio frequency bias is generated by supplying the electrode with about 500 W of power.

The process gases, for example oxidant (e.g., $O_2$), are introduced via one or more inlets 617 and 617'. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gases or gas mixtures may be introduced from a primary gas ring, which may or may not direct the gases toward the substrate surface. Injectors may be connected to the primary gas ring to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate. Process gases exit chamber 603 via an outlet 619. A vacuum pump (e.g., a turbomolecular pump) typically draws process gases out and maintains a suitably low pressure within the reactor.

Reactor pressure is held at a value necessary to sustain the high-density plasma. Preferably the process vessel is maintained at a pressure of at most about 200 mTorr. In some cases, the process chamber pressure is maintained below 1 mTorr. For many applications, however, the pressure is maintained between about 1 and 1000 mTorr; most preferably between about 1 and 30 mTorr. In one embodiment of the invention, the pressure is maintained at about 2 mTorr during annealing.

Wafer temperature should be maintained sufficiently high to ensure that complete film densification. However, the temperature may be limited by process constraints, such as thermal budget limitations that preclude temperatures above 500° C. Such constraints become increasingly common with advanced technologies and corresponding smaller feature sizes. For such applications, the anneal temperature is preferably maintained between about 300 and 500° C. The low frequency power applied to the upper electrode (for generating the plasma) typically varies from 1 kW to 20 kW, and the high frequency power (for biasing the wafer) typically reaches at least about 0.1 W/cm$^2$, for example 1 W/cm$^2$ (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

Although various details of the apparatus have been omitted for clarity's sake, various design alternatives may be implemented.

EXAMPLE

The following example provides details relating to performance advantages of the present invention. It should be understood the following is representative only, and that the invention is not limited by the detail set forth in this example.

Annealing Efficiency

Figure 7:
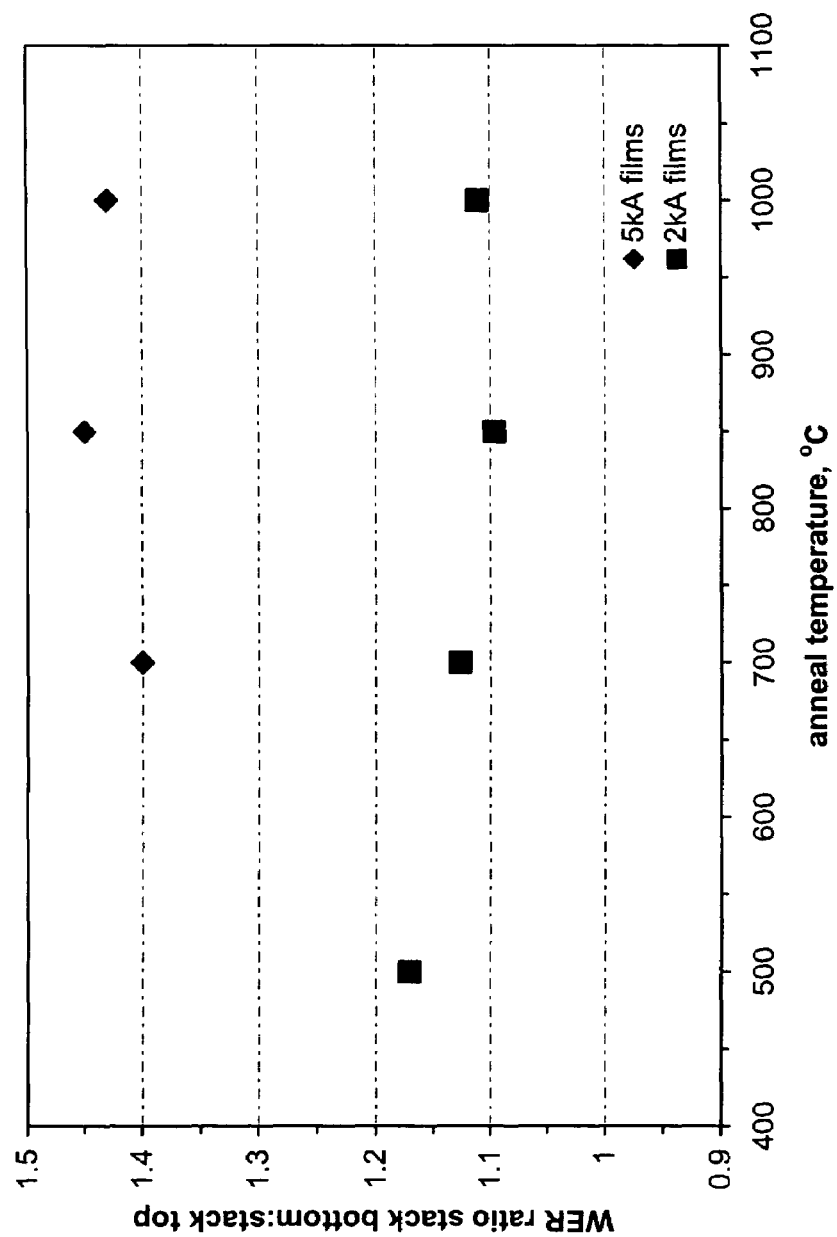
FIG. 7 is a plot showing the effect of film thickness on the efficiency of the densification (anneal) process, demonstrating the effectiveness of the present invention.

FIG. 7 shows the effect of film thickness on the efficiency of the densification (annealing) process. SiO$_2$ films were deposited by RVD using a silicon precursor partial pressure below 10 Torr and a temperature of 230° C. Films were annealed by RTP at the temperatures indicated for at least 5 minutes at ambient pressure in a mixture of 30% steam and 70% N$_2$. The films' wet etch rate, which is a measure of film density, was measured at the top and at the bottom of the stack. For the 5000 Å films, the difference is in the order of 40%, while for films 2000 Å thick the wet etch rate measurements were within 12% at temperatures above 700° C. This result indicates that the thinner films were more efficiently and uniformly densified from top to bottom.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily with reference to a RVD/HDP embodiment herein, other deposition and anneal techniques can also be used in accordance with the invention. Also, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

The invention claimed is:

1. A method of forming a densified dielectric film, the method comprising:
   (a) depositing a thin layer of a silicon oxide-based dielectric film layer on the substrate;
   (b) annealing the dielectric film layer to remove water and fully densify the layer, wherein the annealing comprises a treatment selected from the group consisting of a low temperature oxygen-containing inductively coupled high density plasma (HDP)-based treatment, a furnace-based thermal treatment, and a microwave plasma-based treatment; and
   (c) repeating (a) and (b) at least once to form a densified dielectric film;
   wherein the thickness of the dielectric film layer formed in (a) is insufficient to prevent substantially complete penetration of the annealing agent into the layer and migration of water out of the layer.

2. The method of claim 1, wherein the film layer thickness is between 300 and 3000 Å.

3. The method of claim 1, wherein the film layer thickness is between 500 and 1500 Å.

4. The method of claim 1, wherein the film layer thickness is about 1000 Å.

5. The method of claim 1, wherein (a) comprises a thermal chemical vapor deposition of a silicon-containing precursor.

6. The method of claim 1, wherein the anneal comprises a microwave plasma-based treatment.

7. The method of claim 1, wherein the anneal comprises a laser ablation-based treatment.

8. The method of claim 1, wherein the (a) and (b) are conducted in situ in a single reactor chamber.

9. The method of claim 1, wherein the silicon-containing precursor is at least one of a silanol and a silanediol.

10. The method of claim 1, wherein (a) comprises:
    (i) exposing the substrate surface to a metal catalyst-containing precursor gas to form a substantially saturated layer of metal catalyst-containing precursor on the substrate surface; and
    (ii) exposing the substrate surface to a silicon-containing precursor gas to form a silicon oxide-based dielectric film layer on the substrate.

11. The method of claim 10, wherein the metal catalyst-containing precursor is selected from the list of metal catalyst-containing precursors comprising aluminum, zirconium, hafnium, gallium, titanium, niobium, and tantalum.

12. The method of claim 10, wherein the metal catalyst-containing precursor is an aluminum-containing precursor.

13. The method of claim 10, wherein the aluminum-containing precursor is at least one of hexakis(dimethylamino)aluminum and trimethyl aluminum.

14. The method of claim 1, wherein the anneal comprises a furnace-based thermal treatment.

15. The method of claim 14, wherein the anneal is conducted in an oxidizing environment.

16. The method of claim 1, wherein the (a) and (b) are conducted in separate reactor chambers.

17. The method of claim 16, wherein the separate reactor chambers are integrated in a single apparatus.

18. The method of claim 1, wherein the substrate is a partially fabricated semiconductor wafer.

19. The method of claim 18, wherein the dielectric film is deposited over gaps in the partially fabricated semiconductor wafer.

20. The method of claim 19, wherein the thickness of the film layer is less than half the trench width.

21. The method of claim 20, wherein the thickness of the dielectric film layer formed in (a) is insufficient to prevent substantially complete penetration of the annealing agent into the layer and migration of water out of the layer.

22. The method of claim 1, wherein the anneal comprises a low temperature oxygen-containing inductively coupled high density plasma (HDP)-based treatment.

23. The method of claim 22, wherein the annealing is conducted for a time period of about 10 minutes.

24. The method of claim 22, wherein the HDP anneal is conducted at a temperature of less than 500° C. for at least 5 minutes at a source power of at least 3000 W.

25. The method of claim 24, wherein the annealing is conducted at a temperature between about 400 and 500° C.

26. The method of claim 25, wherein the annealing is conducted at a temperature of about 400° C.

27. The method of claim 22, wherein the oxygen in the plasma is provided by an oxygen-containing precursor gas.

28. The method of claim 27, wherein the oxygen-containing precursor gas comprises one selected from the group consisting of $H_2O$, air, $O_2$, $O_3$ and $H_2O_2$ and combinations thereof.

29. The method of claim 28, wherein the oxygen-containing gas comprises air.

30. The method of claim 29, wherein the oxygen-containing gas comprises $O_2$.

31. The method of claim 30, wherein the $O_2$ has a partial pressure of greater than 100 mTorr.

32. A method of filling a gap on a semiconductor substrate, the method comprising:
    (a) partially filling the gap by depositing a thin layer of a silicon oxide-based dielectric film layer on the substrate;
    (b) annealing the dielectric film layer to remove water and fully densify the layer; and
    (c) repeating (a) and (b) at least once until the gap is filled with a densified dielectric film.

33. The method of claim 32, wherein (a) comprises:
    (i) exposing the substrate surface to a metal catalyst-containing precursor gas to form a substantially saturated layer of metal catalyst-containing precursor on the substrate surface; and
    (ii) exposing the substrate surface to a silicon-containing precursor gas to form a silicon oxide-based dielectric film layer on the substrate.

34. The method of claim 33, wherein the anneal comprises a low temperature oxygen-containing inductively coupled high density plasma (HDP)-based treatment.

* * * * *